(12) United States Patent
Höppel et al.

(10) Patent No.: US 10,381,521 B2
(45) Date of Patent: Aug. 13, 2019

(54) OPTOELECTRONIC COMPONENT AND METHOD FOR PRODUCING AN OPTOELECTRONIC COMPONENT

(71) Applicant: OSRAM Opto Semiconductors GmbH, Regensburg (DE)

(72) Inventors: Lutz Höppel, Alteglofsheim (DE); Dominik Scholz, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/069,129

(22) PCT Filed: Jan. 9, 2017

(86) PCT No.: PCT/EP2017/050330
§ 371 (c)(1),
(2) Date: Jul. 10, 2018

(87) PCT Pub. No.: WO2017/121701
PCT Pub. Date: Jul. 20, 2017

(65) Prior Publication Data
US 2019/0027654 A1 Jan. 24, 2019

(30) Foreign Application Priority Data
Jan. 11, 2016 (DE) .................. 10 2016 100 317

(51) Int. Cl.
*H01L 33/46* (2010.01)
*H01L 33/38* (2010.01)
(Continued)

(52) U.S. Cl.
CPC ........ *H01L 33/46* (2013.01); *H01L 31/02161* (2013.01); *H01L 31/02327* (2013.01);
(Continued)

(58) Field of Classification Search
CPC ......... H01L 33/46; H01L 33/07; H01L 33/30; H01L 31/02161; H01L 31/03046;
(Continued)

(56) References Cited

U.S. PATENT DOCUMENTS 9,082,931 B2 7/2015 Katsuno et al.
9,231,160 B1 1/2016 Uesugi et al.
(Continued)

FOREIGN PATENT DOCUMENTS

EP 2525420 A2 11/2012

*Primary Examiner* — William Coleman
(74) *Attorney, Agent, or Firm* — Slater Matsil, LLP

(57) ABSTRACT

An optoelectronic component and a method for producing an optoelectronic component are disclosed. In an embodiment a component includes a semiconductor layer sequence having a first semiconductor layer, an active layer, a second semiconductor layer and a top side stacked in the recited order, a first contact layer arranged at the first semiconductor layer, a mirror layer arranged on the top side and a recess in the semiconductor layer sequence which extends from the top side through the entire second semiconductor layer and the active layer, wherein the recess has a bottom surface in a region of the first semiconductor layer, wherein the mirror layer covers a portion of the recess in plan view, wherein the first contact layer is in direct electrical and mechanical contact with a contact pin, and wherein the contact pin extends from the first contact layer to the top side of the semiconductor layer sequence.

17 Claims, 4 Drawing Sheets

(51) Int. Cl.
*H01L 33/40* (2010.01)
*H01L 33/44* (2010.01)
*H01L 31/0216* (2014.01)
*H01L 31/0224* (2006.01)
*H01L 31/0232* (2014.01)
*H01L 31/0304* (2006.01)
*H01L 31/0352* (2006.01)
*H01L 31/18* (2006.01)
*H01L 33/00* (2010.01)
*H01L 33/06* (2010.01)
*H01L 33/24* (2010.01)
*H01L 33/30* (2010.01)
*H01L 33/32* (2010.01)
*H01L 33/42* (2010.01)
*H01L 33/20* (2010.01)
*H01L 33/62* (2010.01)

(52) U.S. Cl.
CPC ........ *H01L 31/022466* (2013.01); *H01L 31/03046* (2013.01); *H01L 31/03048* (2013.01); *H01L 31/035236* (2013.01); *H01L 31/035281* (2013.01); *H01L 31/1844* (2013.01); *H01L 31/1848* (2013.01); *H01L 31/1852* (2013.01); *H01L 31/1884* (2013.01); *H01L 33/007* (2013.01); *H01L 33/0066* (2013.01); *H01L 33/06* (2013.01); *H01L 33/24* (2013.01); *H01L 33/30* (2013.01); *H01L 33/32* (2013.01); *H01L 33/382* (2013.01); *H01L 33/405* (2013.01); *H01L 33/42* (2013.01); *H01L 33/44* (2013.01); *H01L 33/20* (2013.01); *H01L 33/62* (2013.01); *H01L 2933/0016* (2013.01); *H01L 2933/0025* (2013.01)

(58) Field of Classification Search
CPC ....... H01L 31/03048; H01L 31/035281; H01L 31/1884; H01L 33/405; H01L 33/20
See application file for complete search history.

(56) References Cited

U.S. PATENT DOCUMENTS

| 2009/0146165 | A1 | 6/2009 | Hasnain et al. |
| 2013/0062657 | A1 | 3/2013 | Fang et al. |
| 2016/0005927 | A1 | 1/2016 | Uesugi et al. |
| 2019/0019918 | A1* | 1/2019 | Vaufrey ................. H01L 33/38 |

\* cited by examiner

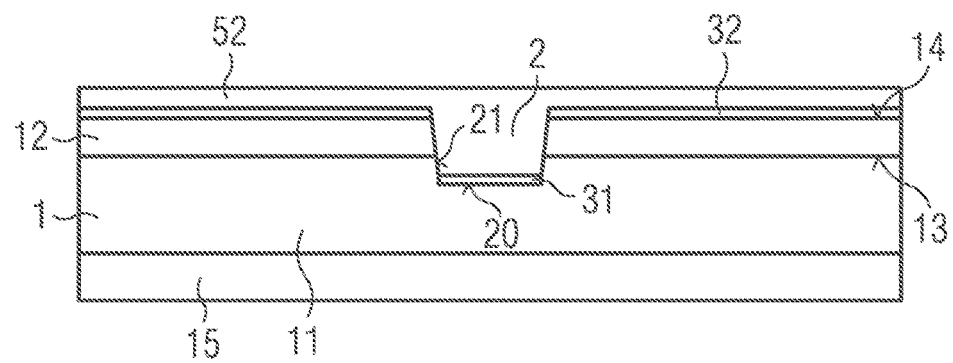
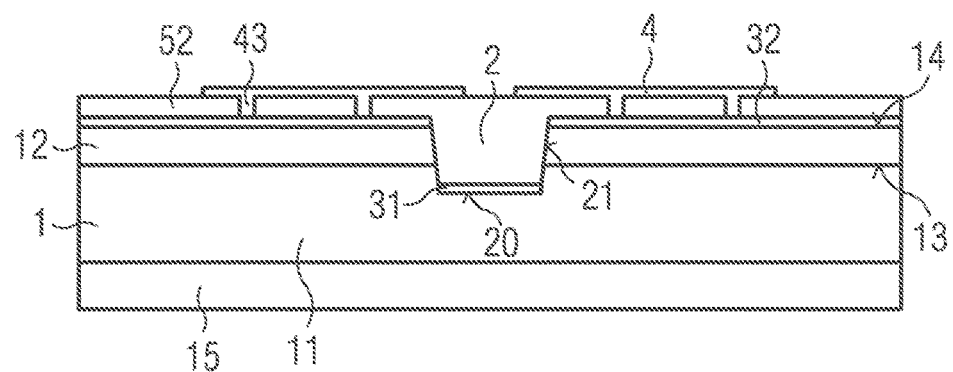
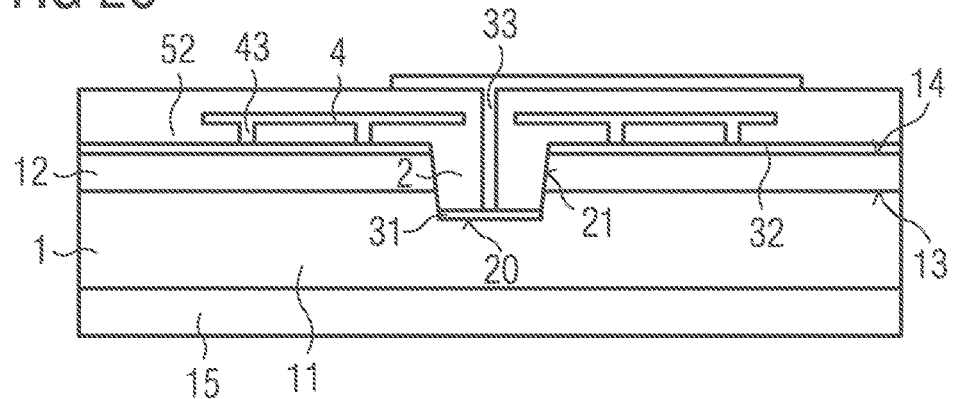

OPTOELECTRONIC COMPONENT AND METHOD FOR PRODUCING AN OPTOELECTRONIC COMPONENT

This patent application is a national phase filing under section 371 of PCT/EP2017/050330, filed Jan. 9, 2017, which claims the priority of German patent application 10 2016 100 317.4, filed Jan. 11, 2016, each of which is incorporated herein by reference in its entirety.

TECHNICAL FIELD

An optoelectronic component is specified. In addition, a method for producing an optoelectronic component is specified.

SUMMARY OF THE INVENTION

Embodiments provide an optoelectronic component in which a region of an active layer as large as possible is used for radiation generation. Further embodiments provide a method for producing such a component.

According to at least one embodiment, the optoelectronic component comprises a semiconductor layer sequence. The semiconductor layer sequence comprises a first layer, an active layer emitting or absorbing radiation during normal operation, a second semiconductor layer and a top side. The layers are stacked in the given order. The second semiconductor layer and the active layer are thus arranged between the top side and the first semiconductor layer. The active layer is disposed between the first semiconductor layer and the second semiconductor layer.

The first semiconductor layer and the second semiconductor layer may be, for example, individual layers. Alternatively, it is also possible that the first and/or the second semiconductor layer comprise a plurality of stacked individual layers. In particular, the second semiconductor layer adjoins both the top side and the active layer. The first semiconductor layer preferably adjoins the active layer and an underside opposite the top side. Both the top side and the underside of the semiconductor layer sequence are, for example, interfaces of the semiconductor layer sequence. The top side and the underside are preferably main sides, that is to say sides with the greatest lateral extent of the semiconductor layer sequence. The active layer preferably runs essentially parallel to the top side and/or underside.

The first semiconductor layer may, for example, be n-type, the second semiconductor layer may be p-type. But a reverse doping is possible as well.

The semiconductor layer sequence is based, for example, on a III-V compound semiconductor material. The semiconductor material is, for example, a nitride compound semiconductor material, such as $Al_nIn_{1-n-m}Ga_mN$, or a phosphide compound semiconductor material, such as $Al_nIn_{1-n-m}Ga_mP$, or also an arsenide compound semiconductor material, such as $Al_nIn_{1-n-m}Ga_mAs$, where $0 \leq n \leq 1$, $0 \leq m \leq 1$ and $m+n \leq 1$, respectively. In this case, the semiconductor layer sequence can have dopants and additional constituents. For the sake of simplicity, however, only the essential constituents of the crystal lattice of the semiconductor layer sequence, i.e., Al, As, Ga, In, N or P, are indicated, even though these can be partially replaced and/or supplemented by small amounts of further substances. The semiconductor layer sequence is preferably based on AlInGaN.

The active layer has, for example, at least one pn junction and/or one quantum well structure in the form of a single quantum well, SQW for short, or in the form of a multi-quantum well structure, MQW for short. During normal operation, the active layer preferably emits electromagnetic radiation in the near UV range and/or in the visible range and/or in the near infrared range.

The optoelectronic component is, for example, a semiconductor chip, such as a thin-film semiconductor chip or a flip-chip. In this case, a semiconductor chip is understood to mean such a component which is produced by singulation of a wafer. In particular, the dimensions of the semiconductor chip are thus defined by dividing lines in the wafer. Traces of a separation process from the wafer can then still be visible on side surfaces of the component.

According to at least one embodiment, the component comprises a first contact layer arranged on the first semiconductor layer, via which the first semiconductor layer is electrically contacted during normal operation. That is, first charge carriers, such as electrons, are injected into the first semiconductor layer via the first contact layer during normal operation.

The first contact layer is preferably based on a different material or consists of a different material than the semiconductor layer sequence. In particular, the first contact layer is not formed from a semiconductor material. For example, the first contact layer comprises or consists of a metal, such as Al or Ag, or a transparent conductive oxide, TCO for short, such as indium tin oxide, ITO for short, or zinc oxide, such as ZnO. The first contact layer may itself comprise a plurality of individual layers arranged one above the other. For example, the first contact layer comprises a single layer of TCO and a single layer of Ag or consists thereof.

According to at least one embodiment, the component comprises a mirror layer arranged on the top side. The second semiconductor layer is electrically contacted via the mirror layer during normal operation. In particular, second charge carriers, such as holes, are injected into the second semiconductor layer via the mirror layer. The mirror layer can be, for example, a metallic layer and comprises, for example, Al or Ag or Rh or consists thereof. The first mirror layer has, for example, a thickness which is constant within the scope of the manufacturing tolerance and which amounts to between 100 nm and 1 μm or between 200 nm and 600 nm inclusive.

The first mirror layer can be applied directly to the top side, in particular directly to the second semiconductor layer. Alternatively, however, it is also possible that the mirror layer is spaced from the top side, in particular from the second semiconductor layer, by an intermediate layer.

According to at least one embodiment, the optoelectronic component comprises a recess in the semiconductor layer sequence. The recess may be a hole or a trench in the semiconductor layer sequence. In particular, the recess forms a region in the semiconductor layer sequence in which a via is arranged. The first contact layer is in particular a part of the via.

The recess extends from the top side through the entire second semiconductor layer and the entire active layer into the first semiconductor layer. The recess opens into the first semiconductor layer and does not penetrate it completely.

According to at least one embodiment, the recess has a bottom surface in the region of the first semiconductor layer, said bottom surface is delimited in the lateral direction, parallel to the active layer, by at least one side wall running transversely to the active layer. For example, the bottom surface extends substantially parallel to the active layer. The side wall is perpendicular or at an angle of between 45° and 90° inclusive to the active layer. For example, the recess is introduced as a cylindrical hole in the semiconductor layer sequence. The bottom surface of the recess is then formed by the bottom surface of the cylinder. The side wall of the recess is formed by the lateral surface of the cylinder.

Alternatively, it is also possible that the recess comprises a plurality of side walls. For example, the bottom surface is completely surrounded in the lateral direction by side walls of the recess. In this case, the recess is formed, for example, as a hole having a rectangular cross-sectional shape in the semiconductor layer sequence. On the other hand, if the recess is formed as a trench, the recess comprises, for example, two side walls which are opposite one another.

The statements made below always refer to the case of only one side wall. If the recess comprises a plurality of side walls, all the features disclosed for one side wall may also be disclosed for the other side walls.

According to at least one embodiment, both the bottom surface and the side wall of the recess are formed by the semiconductor layer sequence. The side wall and the bottom surface thus consist of the material of the semiconductor layer sequence. In other words, the recess is limited in the lateral direction and in the direction away from the top side by the semiconductor layer sequence.

According to at least one embodiment, the first contact layer is applied directly to the bottom surface of the recess. In particular, the first contact layer is applied directly to the first semiconductor layer in the region of the bottom surface. The first contact layer partially or completely covers the bottom surface. In the region of the recess, the first contact layer is formed preferably simply connected. By way of example, the first contact layer comprises a layer of an above-mentioned TCO, which is in direct contact with the first semiconductor layer.

According to at least one embodiment, a portion of the recess is covered by the mirror layer in a plan view of the top side. In particular, the first mirror layer thus projects partially over the recess in the lateral direction. In other words, the mirror layer forms a projection that projects beyond the recess. The part of the mirror layer that projects beyond the recess is stabilized, for example, by a dielectric material in the recess and thus prevented from kinking.

In other words, the top side has an opening formed by the recess, from which the recess extends into the semiconductor layer sequence. In plan view of the top side, the opening in the top side formed by the recess is partially covered, for example, to at least 2% or to at least 4% or to at least 10% or to at least 14% by the mirror layer.

The mirror layer is preferably formed contiguous and has a hole. The hole of the mirror layer may be smaller in its lateral extent than the lateral extent of the recess or of the opening. For example, in plan view of the top side, the hole of the mirror layer is arranged completely in the region of the recess. In particular, in plan view, the hole in the mirror layer and the opening formed by the recess in the top side may be circles arranged concentrically.

If the recess is formed, for example, as a trench in the semiconductor layer sequence, the mirror layer may have a gap, which, in plan view, is arranged completely in the region of the trench, for example. The gap width is preferably smaller than the width of the opening formed by the trench in the top side.

In at least one embodiment, the optoelectronic component comprises a semiconductor layer sequence with a first semiconductor layer, an active layer emitting or absorbing electromagnetic radiation during operation, a second semiconductor layer and a top side, which are arranged one above the other in this order. On the first semiconductor layer, a first contact layer is applied, via which the first semiconductor layer is electrically contacted during normal operation. On the top side, a mirror layer is arranged, via which the second semiconductor layer is electrically contacted during operation. The component further comprises a recess in the semiconductor layer sequence, which extends from the top side through the entire second semiconductor layer and the active layer and opens into the first semiconductor layer. In the region of the first semiconductor layer, the recess has a bottom surface, which is delimited in the lateral direction, parallel to the active layer, by at least one side wall running transversely to the active layer. In this case, the bottom surface and the side wall of the recess are formed by the semiconductor layer sequence. The first contact layer is applied directly to the bottom surface of the recess. Seen in plan view of the top side, the mirror layer covers a portion of the recess.

Embodiments of the invention described herein are based inter alia on the finding that optoelectronic components with vias do not emit radiation in the region of the vias. In addition, also the region immediately around the via is not used for radiation emission. For example, this is due to the fact that the mirror layer on the top side is, as a result of the production, retracted laterally from the opening formed by the recess in the top side. Between the via and the mirror layer, a distance is then present in the region of which the active layer does not emit electromagnetic radiation.

In contrast, in embodiments of the invention described herein, the mirror layer is at least partially drawn into the opening or recess, as a result of which the non-radiation-emitting region of the active layer is reduced. Drawing the mirror layer into the opening or recess is made possible, for example, by the production method for an optoelectronic component described below.

According to at least one embodiment, the mirror layer is formed contiguously and preferably formed in one piece. For example, the mirror layer has a main extension in the lateral direction in the region laterally adjacent to the recess.

According to at least one embodiment, in the region of the recess, the mirror layer is drawn in the direction of the bottom surface and runs at least partially transversely to the active layer. In a plan view of the side wall, a portion of the side wall is covered by the mirror layer. In the region of the recess, the mirror layer thus runs at least partially parallel or nearly parallel to the side wall.

In other words, the mirror layer has a kink in the region of the recess, at which a lateral main extension of the mirror layer merges into a main extension running transversely to the active layer.

According to at least one embodiment, in the region of the recess, the mirror layer is drawn at least as far toward the bottom surface, that in plan view of the side wall, the side wall is covered by the mirror layer at the level of the active layer. In other words, the first mirror layer extends into the recess at least as far as the active layer. In this way, the first mirror layer can be used as a lateral reflection of the recess, so that electromagnetic radiation generated by the active layer in the region adjacent to the recess is reflected away from the recess. This increases the efficiency of the component.

According to at least one embodiment, viewed in plan view of the side wall, the mirror layer covers at least 25% or at least 35% or at least 45% of the side wall.

According to at least one embodiment, the first contact layer and the mirror layer partly overlap one another, as seen in plan view on the top side. When viewed in plan view of the top side, a hole in the mirror layer is, for example, completely disposed in the region of the bottom surface covered by the first contact layer.

According to at least one embodiment, the mirror layer has a reflectivity for a radiation emitted by the active layer during normal operation of at least 80% or at least 90% or at least 95%. The reflectivity is measured, for example, at the wavelength at which the emitted radiation has an intensity maximum. In particular, the first mirror layer has a reflectivity of at least 80% in the visible spectral range.

According to at least one embodiment, the depth of the recess, measured from the top side to bottom surface, is at least 200 nm or at least 500 nm or at least 700 nm. Alternatively or additionally, the depth is at most 1000 nm or 800 nm or 500 nm.

According to at least one embodiment, the distance between the active layer and the top side, in particular the thickness of the second semiconductor layer, is at least 50 nm or at least 80 nm or at least 120 nm. Alternatively or additionally, the distance is at most 180 nm or at most 150 nm or at most 120 nm.

According to at least one embodiment, the thickness of the first contact layer is at most 300 nm or at most 200 nm or at most 150 nm. Alternatively or additionally, the thickness of the first contact layer is at least 50 nm or at least 100 nm or at least 150 nm.

According to at least one embodiment, a first intermediate layer is arranged between the mirror layer and the semiconductor layer sequence. The first intermediate layer can be arranged everywhere between the mirror layer and the semiconductor layer sequence, in particular in the region of the top side. For example, if the mirror layer is drawn into the recess and covers a portion of the side wall, then the first intermediate layer may also be arranged between the side wall and the mirror layer.

In particular, the first intermediate layer comprises a material transparent to the radiation emitted by the active layer. For example, the first intermediate layer comprises a silicon oxide, such as $SiO_2$, or a silicon nitride, such as SiN, or an aluminum oxide, such as $Al_2O_3$, or a titanium oxide, such as $TiO_2$, or a niobium oxide, such as $Nb_2O_5$. Also, a multi-layer structure of the mentioned materials is possible for the intermediate layer. The first intermediate layer has, for example, a thickness of between 50 nm and 1000 nm, preferably between 50 nm and 300 nm inclusive.

The first intermediate layer is electrically insulating at least with regard to the second semiconductor layer. That is, the first intermediate layer does not conduct any significant current from the mirror layer to the second semiconductor layer during normal operation. With regard to the first semiconductor layer, the first intermediate layer can likewise act electrically insulating.

According to at least one embodiment, the first intermediate layer covers the side wall in the recess and reshapes the side wall in a form-fitting manner. Preferably, the first intermediate layer covers the entire side wall up to the bottom surface. In particular, in the region of the recess, the first intermediate layer is in direct mechanical contact with the side wall and the mirror layer. The first intermediate layer is formed, for example, contiguously.

According to at least one embodiment, a second contact layer is arranged between the first intermediate layer and the top side, that is to say in particular between the first intermediate layer and the second semiconductor layer. The second contact layer may comprise or consist of a metal or preferably of a TCO, such as ITO. In particular, the second contact layer is in direct electrical and mechanical contact with the first intermediate layer and with the semiconductor layer sequence, preferably with the second semiconductor layer. The second contact layer preferably extends as far as the opening formed by the recess in the top side and terminates flush with the side wall of the recess in the lateral direction.

According to at least one embodiment, the second contact layer and the mirror layer are electrically conductively connected to each other via vias in the first intermediate layer. The vias may be, for example, holes in the first intermediate layer that are filled with the material of the mirror layer and/or the material of the second contact layer. In the region of the vias, therefore, the second contact layer and the mirror layer are in direct mechanical contact with each other.

According to at least one embodiment, the entire bottom surface of the recess is covered by the first contact layer. The first contact layer directly adjoins the semiconductor layer sequence in the region of the side wall. In the region of the side wall, no further material or no further layer is then arranged between the semiconductor layer sequence and the first contact layer. That is, the first contact layer fills completely a lower portion of the recess, which faces the first semiconductor layer.

According to at least one embodiment, the thickness of the first contact layer is chosen such that the first contact layer does not project beyond the active layer in the direction away from the bottom surface. In particular, the first contact layer is in direct mechanical contact with the side wall only in the region of the first semiconductor layer.

According to at least one embodiment, the first contact layer is in direct electrical and mechanical contact with a contact pin. The contact pin preferably extends from the first contact layer to the top side of the semiconductor layer sequence, and particularly preferably extends beyond it. The contact pin comprises, for example, a metal such as Ag, Al, Au, Pt, Pd, Cu, W, Ti, Rh or alloys thereof. The contact pin is used in the intended operation for the transport of charge carriers from the top side to the first contact layer. The contact pin is part of a via, for example. The contact pin has, for example, the geometric shape of a cylinder, wherein, preferably, the bottom surface of the cylinder is chosen to be smaller than the area of the first contact layer.

In particular, the contact pin does not need to be optimized for its optical properties, such as reflective properties, when, for example, the mirror layer is drawn into the recess. The contact pin can then be optimized only with respect to good electrical properties, for example, a good connection contact to the first contact layer.

According to at least one embodiment, the contact pin is embedded in an electrically insulating filling material filling up the recess and, for example, in direct contact with the filling material. The second contact pin is electrically insulated at least from the second semiconductor layer and the mirror layer by the filling material. The filling material comprises or consists of, for example, a silicone or an epoxide or a silicon oxide, such as $SiO_2$, or a silicon nitride, such as SiN, or an aluminum oxide, such as $Al_2O_3$, or a titanium oxide, such as $TiO_2$, or a niobium oxide, such as $Nb_2O_5$.

According to at least one embodiment, the filling material is applied directly to the mirror layer inside the recess. The mirror layer is covered, for example, in the region of the side wall by the filling material.

According to at least one embodiment, the filling material is applied directly to the mirror layer on the top side and forms a layer on the mirror layer. The thickness of the layer formed by the filling material at the top side is, for example, between 50 nm and 500 nm inclusive. For example, the thickness of this layer on the mirror layer is constant within the manufacturing tolerance.

According to at least one embodiment, the filling material is in direct contact with the semiconductor layer sequence in the region of the recess. For example, the mirror layer is then applied to the filling material in the region of the recess. A first intermediate layer is preferably not used in this case.

According to at least one embodiment, throughout the whole region of the recess, the mirror layer extends substantially parallel to the main extension direction of the top side. In particular, in this case, the mirror layer is not drawn in the direction of the bottom surface in the region of the recess and does not protrude into the recess, but does not change its main extension direction from the region next to the recess to the region in the recess. In other words, everywhere above the opening formed by the recess in the top side, the mirror layer runs parallel or nearly parallel to the top side. The mirror layer then has also no kink in the region of the recess on which the direction of extension of the mirror layer changes.

For example, the filling material forms a flat surface in the direction away from the semiconductor layer sequence, said flat surface extends both over the region laterally adjacent to the recess and over the region of the recess. On this flat surface, the mirror layer may be applied.

According to at least one embodiment, the recess tapers, in particular continuously and/or steadily, in the direction of the bottom surface. That is, the bottom surface has a smaller lateral extent than the opening formed by the recess in the top side. In plan view of the top side, the opening in the top side, for example, completely covers the bottom surface. For example, the lateral extent of the bottom surface is at most 95% or at most 90% or at most 80% or at most 70% of the lateral extent of the opening.

Alternatively, however, it is also possible for the recess to broaden, in particular continuously and/or steadily, in the direction of the bottom surface. The side walls are formed, for example, overhanging partially or everywhere. In particular, the opening in the top side, viewed in plan view of the top side, can then be arranged completely in the region of the bottom surface. For example, the lateral extent of the opening is at most 95% or at most 90% or at most 80% or at most 70% of the lateral extent of the bottom surface.

In addition, a method for producing an optoelectronic component is specified. The method is suitable in particular for producing an optoelectronic component described herein. All features disclosed for the optoelectronic component are thus disclosed for the method and vice versa.

According to at least one embodiment, the method comprises a step A), in which a semiconductor layer sequence applied to a substrate is provided. The semiconductor layer sequence has grown, for example, on the substrate. The substrate may be a sapphire substrate. The semiconductor layer sequence has top side facing away from the substrate. Furthermore, the semiconductor layer sequence has a first semiconductor layer facing the substrate, a second semiconductor layer facing away from the substrate, and an active layer arranged between the first and the second semiconductor layer.

In a step B), a mask with at least one opening is applied to the top side of the semiconductor layer sequence. The mask is, for example, a photomask, wherein the opening in the mask may be produced via a lithography step. The mask comprises, for example, a photoresist or is formed from it. In the region of the opening, the top side of the semiconductor layer sequence or a second contact layer located thereon is initially exposed.

In a step C), the semiconductor layer sequence is partially removed in the region of the opening, so that a recess occurs in the semiconductor layer sequence. The recess extends from the top side through the entire second semiconductor layer and the active layer and opens into the first semiconductor layer. In this case, in the region of the first semiconductor layer, the recess has a bottom surface, which is delimited in the lateral direction, parallel to the active layer, by at least one side wall running transversely to the active layer.

In a step D), a first contact layer is deposited directly on the first semiconductor layer in the region of the bottom surface. For the deposition of the first contact layer, a directional process such as evaporation or low pressure deposition is used. As a result, it is preferably achieved that the first contact layer deposits only on the bottom surface, but not or not noticeably on the side wall of the recess. For the deposition of the first contact layer, in particular the same mask is used as for the creation of the recess. In particular, no other or no additional mask is used for the deposition process of the first contact layer.

The fact that the same mask and a directional deposition process are used eliminates possible alignment tolerances to be maintained, so that the largest possible region of the bottom surface, preferably the entire bottom surface, can be covered by the first contact layer.

In a step E), a mirror layer is deposited on the top side and in the region of the recess, wherein the mirror layer is electrically conductively connected to the second semiconductor layer. The mirror layer is applied, for example, on the side wall and the bottom surface of the recess. In particular, the mirror layer is applied as a simply connected layer. The deposition of the mirror layer can take place via a non-directional process, such as sputtering.

In a step F), the mirror layer is removed in the region above the first contact layer, for example, in the region of the bottom surface. In this case, the first contact layer is exposed, for example. The mirror layer partially covers the recess in the finished component when viewed in plan view. In particular, the mirror layer is therefore not removed in the entire region of the recess, but only in a region which is smaller than an opening formed by the recess in the top side.

According to at least one embodiment, steps A) to F) are carried out as individual, successive steps in the stated order.

According to at least one embodiment, after step D) and before step E), a first intermediate layer is applied to the top side, the side wall and the first contact layer. The first intermediate layer, for example, has a constant thickness within the scope of the manufacturing tolerance. In particular, the first intermediate layer reshapes the recess in a form-fitting manner. The first intermediate layer is preferably applied as a simply connected layer.

According to at least one embodiment, in step E) the mirror layer is applied in a form-fitting manner to the first intermediate layer, so that, in the region of the recess, the first mirror layer extends at least partially transversely to the active layer and at least a part of the side wall is covered by the mirror layer in a plan view of the side wall. The mirror layer thus preferably reshapes the first intermediate layer and thus the shape of the recess. The mirror layer is preferably applied directly to the first intermediate layer. Furthermore, the mirror layer may also have a constant thickness within the manufacturing tolerance.

According to at least one embodiment, after step F), the recess is completely filled with a filling material. For example, the filling material exceeds the recess in the direction away from the top side. Subsequently, a hole is formed in the filling material and the first intermediate layer so that the first contact layer is exposed. In a subsequent step, a contact pin is formed in the hole, which is guided, starting from the first contact layer, in the direction of the top side and protrudes beyond the top side.

According to at least one embodiment, a filling material is filled into the recess before the step E), which completely fills the recess. The filling material is preferably in direct contact with the semiconductor layer sequence in the region of the side wall and the bottom surface. After step F), a hole is formed in the filling material so that the first contact layer is exposed. In a subsequent step, a contact pin is formed in the hole, which is guided starting from the first contact layer in the direction of the top side and protrudes beyond the top side.

BRIEF DESCRIPTION OF THE DRAWINGS

In the following, an optoelectronic component described herein as well as a method described herein will be explained in more detail with reference to drawings on the basis of exemplary embodiments. The same reference numerals indicate the same elements in the individual figures. However, no scale relationships are shown, but individual elements may be exaggerated for better understanding.

As shown in:

FIGS. 2A to 2C show various positions in a further exemplary embodiment of a production method.

DETAILED DESCRIPTION OF ILLUSTRATIVE EMBODIMENTS

Figure 1A:
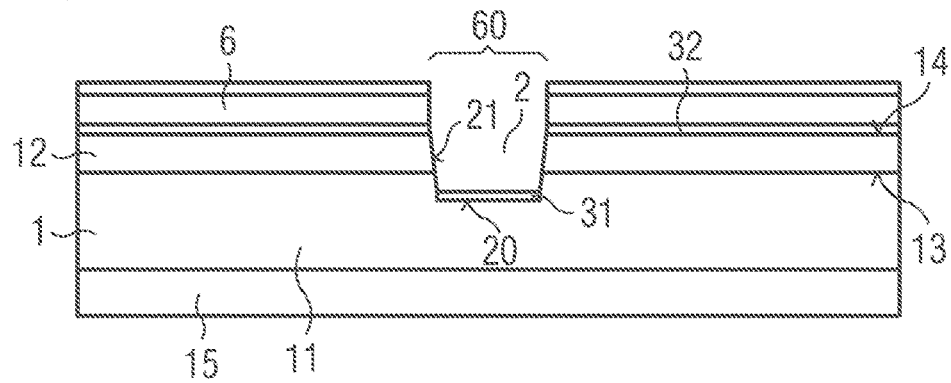
FIGS. 1A to 1D show various positions in a production method for an optoelectronic component.

FIG. 1A shows a position in an exemplary embodiment of a production method for an optoelectronic component 100. On a substrate 15, for example, a sapphire substrate 15, a semiconductor layer sequence 1 is applied. The semiconductor layer sequence 1 may be a GaN semiconductor layer sequence that has grown on the substrate 15. Starting from the substrate 15, the semiconductor layer sequence 1 comprises a first semiconductor layer 11, then an active layer 13 and a second semiconductor layer 12. The semiconductor layer sequence 1 is terminated by a top side 14 opposite the substrate 15.

The active layer 13 is configured, for example, to emit electromagnetic radiation, in particular visible light, during normal operation. The first semiconductor layer 11 is, for example, an n-type GaN layer, and the second semiconductor layer 12 is a p-type GaN layer.

The top side 14 is covered with a second contact layer 32 that is in direct electrical and mechanical contact with the second semiconductor layer 12. The second contact layer 32 is, for example, a layer of a transparent conductive oxide, such as ITO.

A recess 2 is also introduced into the semiconductor layer sequence 1, said recess 2 extends from the top side 14 through the entire second semiconductor layer 12 and the active layer 13 into the first semiconductor layer 11 and opens into the first semiconductor layer 11. Accordingly, the top side 14 has an opening or interruption, from which the recess 2 extends in the direction of the first semiconductor layer 11. In the region of the first semiconductor layer 11, the recess 2 has a bottom surface 20, which runs essentially parallel to the active layer 13. In the lateral direction, parallel to the active layer 13, the bottom surface 20 is delimited by side walls 21 running transversely to the active layer 13.

In the present case, the recess 2 is, for example, a hole in the semiconductor layer sequence 1, which is completely surrounded in the lateral direction by side walls 21.

On the bottom surface 20 of the recess 2, a first contact layer 31 is applied, which is in direct mechanical and electrical contact with the first semiconductor layer 11 in the region of the bottom surface 20. The first contact layer 31 completely covers the bottom surface 20 and is also in direct mechanical and electrical contact with the first semiconductor layer 11 in the region of the side walls 21.

The first contact layer 31 has, for example, a thickness of between 50 nm and 500 nm inclusive. In particular, the first contact layer 31 comprises, for example, one or more individual layers. For example, a single layer in direct contact with the first semiconductor layer 11 is formed of a transparent conductive oxide, such as ZnO. A subsequent single layer of the first contact layer 31 is formed, for example, from Ag.

In addition, a mask 6 with an opening 60 is applied to the second contact layer 32. With the help of the mask 6 and the opening 6o, the recess 2 has been produced, for example, via an etching process. Also for the application of the first contact layer 31, the mask 6 has been used. In this case, the first contact layer 31 was deposited by evaporation, for example, whereby only the laterally extending bottom surface 20 and the side of the mask 6 facing away from the top side 14 were covered by the first contact layer 31. The side walls 21 were not covered by the first contact layer 31 by the directional deposition process.

Figure 1B:
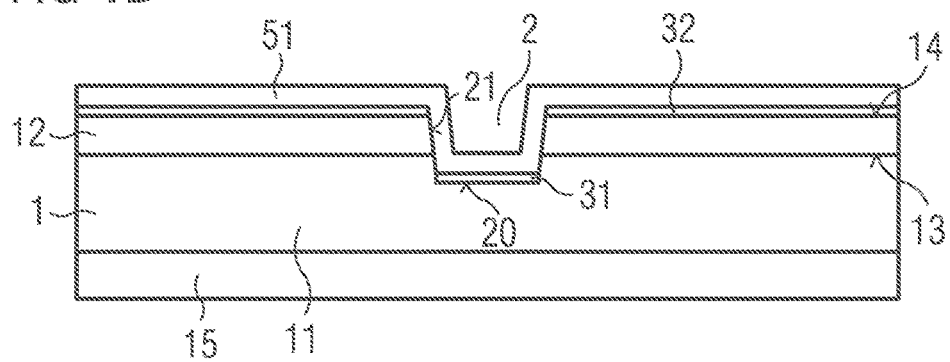

FIG. 1B shows a further position in the method in which a first intermediate layer 51, for example, of $SiO_2$, is applied to the top side 14 and in the region of the recess 2. The application of the first intermediate layer 51 is effected, for example, by means of a sputtering process, after the mask 6 has been detached. Subsequently, the first intermediate layer 51 has been polished, for example. After the polishing step, the roughness of the first intermediate layer 51 is, for example, at most 1 nm, whereas without the polishing step, the roughness is at least 5 nm, for example.

In FIG. 1B, the first intermediate layer 51 is applied as a simply connected layer, which reshapes the top side 14 and the recess 2 in a form-fitting manner and which has a constant thickness within the manufacturing tolerance. In particular, the first intermediate layer 51 is in direct contact with the top side 14, the side wall 21 and the first contact layer 31.

Figure 1C:
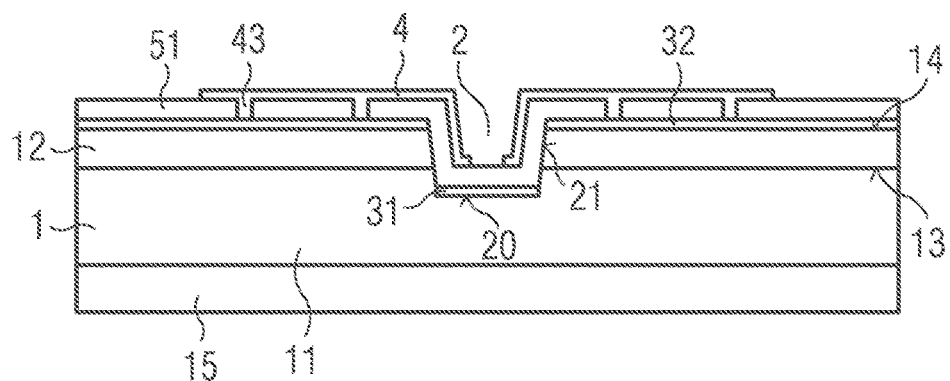

FIG. 1C shows a further position in the method in which a mirror layer 4 having a thickness which is constant within the scope of the manufacturing tolerance is applied to the top side 14. The mirror layer 4 is formed, for example, of a highly reflective material, such as Ag or Al. The mirror layer 4 covers both the side walls 21 and the top side 14 of the semiconductor layer sequence 1. In the region outside the recess 2, the mirror layer 4 extends in a lateral direction parallel to the top side 14. In the region of the recess 2, the mirror layer 4 has a kink and changes its lateral main extension to a main extension transverse to the active layer 13. In the region of the recess 2, the mirror layer 4 is thus drawn in the direction of the bottom surface 20 and, in plan view of the side walls 21, covers the side walls 21, for example, to at least 25%. In particular, the mirror layer 4 covers the side walls 21 in the region or at the level of the active layer 13.

The mirror layer 4 is in direct contact with the first intermediate layer 51. An electrical contact of the mirror layer 4 to the second contact layer 32 and thus to the second semiconductor layer 12 is produced via vias 43 in the first intermediate layer 51. The vias 43 are holes in the first intermediate layer 51, which are filled with the material of the mirror layer 4.

In the region of the bottom surface 20, the mirror layer 4 is partially removed, so that seen in plan view of the top side 14, a part of the bottom surface 20 or of the first contact layer 31 is not covered by the mirror layer 4.

Figure 1D:
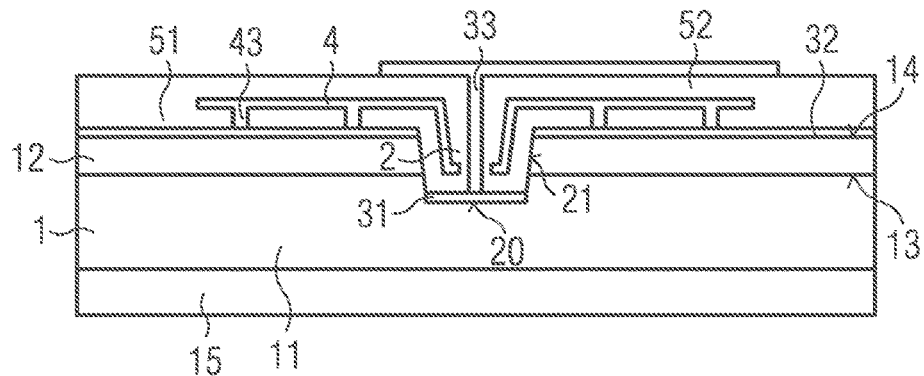

FIG. 1D shows a further position in the method in which a filling material 52 is introduced onto the mirror layer 4 and into the region of the recess 2. The filling material 52 consists, for example, of $SiO_2$. In addition, a hole is formed in the filling material 52, in which a contact pin 33, for example, made of Al, Cu or Au, is formed. The contact pin 33 is in direct contact with the first contact layer 31 and extends from the first contact layer 31 in the direction of the top side 14 and projects beyond the top side 14, the first intermediate layer 51, the mirror layer 4 and the filling material 52. In the region of the recess 2 and on the top side 14, the contact pin 33 is electrically isolated from the mirror layer 4 and the second semiconductor layer 12 by the filler material 52.

Figure 1E:
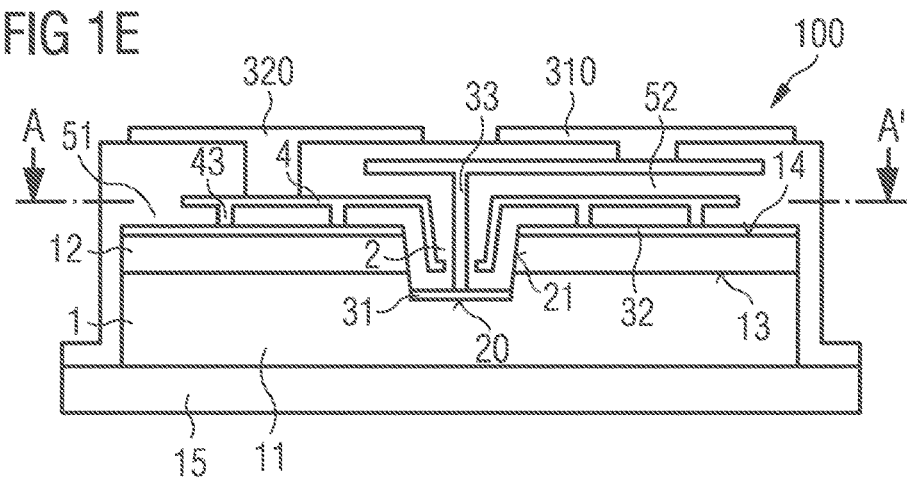
FIG. 1E, FIG. 1F and FIG. 3 show exemplary embodiments of an optoelectronic component in lateral cross-sectional view and in plan view.

FIG. 1E shows an exemplary embodiment of an optoelectronic component 100 in a lateral cross-sectional view, as it is produced, for example, by the previously described method. The component 100 is, for example, a so-called flip-chip, i.e., a semiconductor chip in which the radiation exit surface is formed by the substrate 15 and electrical contact elements 310, 320 for the supply of electrons and holes are arranged on a side opposite the radiation exit surface. In contrast to the component in the manufacturing process of FIG. 1D, a first contact element 310 is applied to the finished component 100 of FIG. 1E, said first contact element 310 is in electrical contact with the contact pin 33 and thus in electrical contact with the first semiconductor layer 11. A second contact element 320 is brought into electrical contact with the mirror layer 4. The contact elements 310, 320 are exposed on the side opposite of the growth substrate 15 and consist, for example, of metal.

In addition, it can be seen in FIG. 1D that the semiconductor component 100 has a single, contiguous active layer 13, which extends over almost the entire lateral extent of the component 100.

Figure 1F:
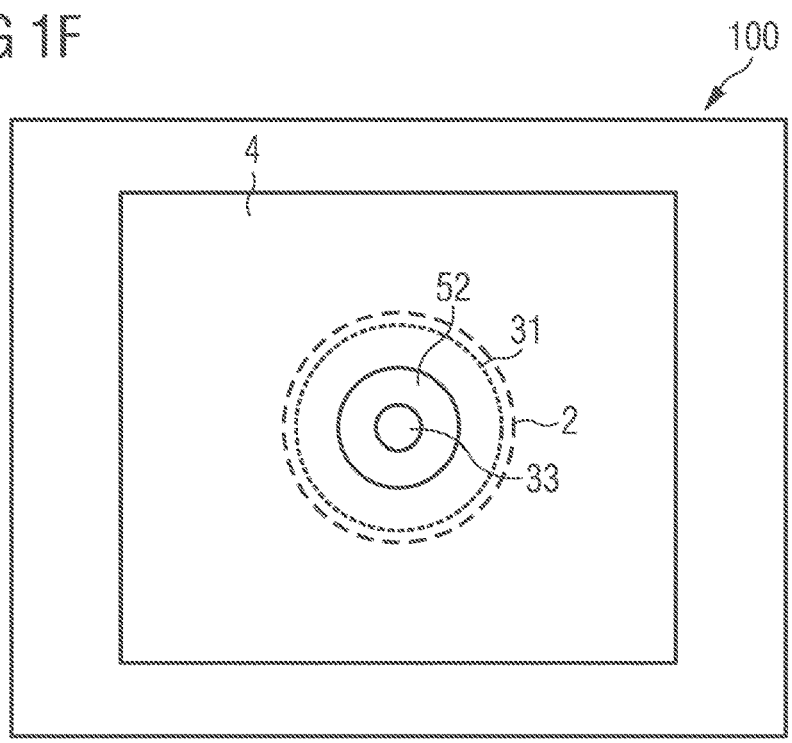

FIG. 1F shows a plan view of the optoelectronic component 100 of FIG. 1E. Shown here is the plan view of a sectional plane AA' of FIG. 1E, which is drawn parallel to the top side 14 through the mirror layer 4. It can be seen in FIG. 1F that the opening formed by the recess 2 in the top 14, indicated by the dashed line, has a circular basic shape. The mirror layer 4 is formed contiguously and also comprises a circular hole that is completely arranged within the opening. In particular, therefore, in the plan view illustrated in FIG. 1F, the mirror layer 4 partially covers the recess 2, in the present case, for example, by more than 14%.

The contact pin 33 is arranged in the hole of the mirror layer 4, said contact pin 33 is in direct contact with the first mirror layer 31, indicated by the dotted line, on the bottom surface 20. In plan view of the top side 14, also the first contact layer 31 is partially covered by the mirror layer 4, as can be seen from FIGS. 1E and 1F.

FIG. 2A shows a position in a further exemplary embodiment of a production method for optoelectronic components 100. The position shown in FIG. 2A, for example, follows the position of FIG. 1A. In contrast to FIG. 1B, in FIG. 2A, the recess 2 is completely filled with a filling material 52 which covers both the side walls 21 and the first contact layer 31 and is in direct contact therewith. In the region of the top side 14, the filling material 52 forms a layer. The side of the filling material 52 facing away from the substrate 15 forms a flat area which extends over the entire top side 14 and also over the entire recess 2.

In the position of FIG. 2B, a method step is shown, in which a mirror layer 4, which is electrically conductively connected to the second contact layer 32 via vias 43, is applied to the filling material 52. The mirror layer 4 is initially applied in a simply connected manner over the entire area of the recess 2. Subsequently, with the help of a mask, a part of the mirror layer 4 is exposed again in the region of the recess 2, so that the mirror layer 4 only partially covers the recess 2 in plan view of the top side 14. In the region where the mirror layer 4 is removed, the filling material 52 is exposed.

FIG. 2C shows a position in the method in which, in the region where the mirror layer 4 is removed from the filling material 52, a contact pin 33 is formed which completely penetrates the filling material 52 and reaches to the first contact layer 31. The contact pin 31 serves for electrically contacting the first semiconductor layer 11.

The position of FIG. 2C is followed, for example, by the same method steps that also follow the position of FIG. 1D and serve to complete the component 100.

In the previous embodiments, the recess 2 tapers from the top side 14 in the direction of the bottom surface 20. The lateral extent of the recess 2 decreases continuously and steadily in the direction of the bottom surface 20. However, in all exemplary embodiments, the recess 2 can broaden in the direction of the bottom surface. This is shown in the exemplary embodiment of FIG. 3. The side walls 21 have an overhang and the bottom surface 20 has a greater lateral extent than the opening formed in the top side 14 by the recess 2.

Figure 3:
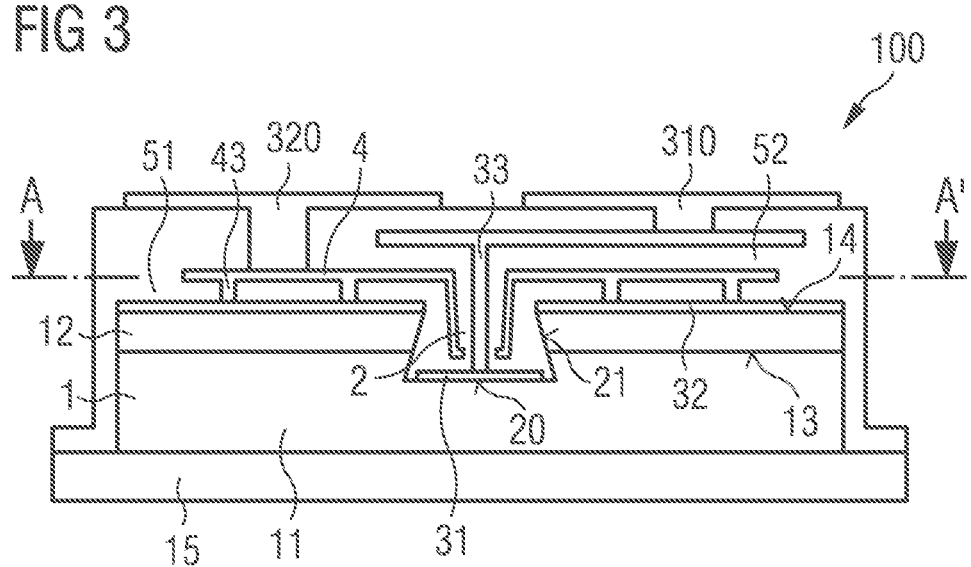

In FIG. 3, moreover, the bottom surface 20 is not completely covered by the first contact layer 31 but is free from the first contact layer 31 in the shadow cast by the overhang on the bottom side 20. This may be a consequence of the directional process used for applying the first contact layer 31. Alternatively, however, it is also possible, for example, by using a less directional process, to cover the entire bottom surface 20 with the first contact layer 31, i.e., also in the region of the shadow.

The invention described herein is not limited by the description in conjunction with the exemplary embodiments. Rather, the invention comprises any new feature as well as any combination of features, particularly including any combination of features in the patent claims, even if said feature or said combination per se is not explicitly stated in the patent claims or exemplary embodiments.

The invention claimed is:

1. An optoelectronic component comprising:
   a semiconductor layer sequence having a first semiconductor layer, an active layer configured to emit or absorb electromagnetic radiation during operation, a second semiconductor layer and a top side stacked in the recited order;
   a first contact layer arranged at the first semiconductor layer, via which the first semiconductor layer is configured to be electrically contacted during operation;

a mirror layer arranged on the top side, via which the second semiconductor layer is configured to be electrically contacted during operation; and a recess in the semiconductor layer sequence which extends from the top side through the entire second semiconductor layer and the active layer and which opens into the first semiconductor layer, wherein the recess has a bottom surface in a region of the first semiconductor layer, the bottom surface being delimited in a lateral direction, parallel to the active layer, by at least one side wall running transversely to the active layer, wherein the bottom surface and the side wall of the recess are formed by the semiconductor layer sequence, wherein the first contact layer is located directly on the bottom surface, wherein the mirror layer covers a portion of the recess in plan view of the top side, wherein the first contact layer is in direct electrical and mechanical contact with a contact pin, and wherein the contact pin extends from the first contact layer to the top side of the semiconductor layer sequence.

2. The optoelectronic component according to claim 1, wherein the mirror layer is arranged contiguously in a region adjacent to the recess, wherein the mirror layer has a main extension in the lateral direction, and wherein in the region of the recess, the mirror layer is drawn in a direction of the bottom surface and runs at least partially transversely to the active layer so that in plan view of the side wall at least a portion of the side wall is covered by the mirror layer.

3. The optoelectronic component according to claim 1, wherein the first contact layer and the mirror layer partially overlap with each other as seen in plan view of the top side.

4. The optoelectronic component according to claim 1, wherein the first contact layer comprises a metal or a transparent conductive oxide, wherein the mirror layer comprises a metal, and wherein the mirror layer has a reflectivity for a radiation emitted by the active layer during normal operation of at least 80%.

5. The optoelectronic component according to claim 1, wherein a depth of the recess, measured from the top side to the bottom surface, is between 200 nm and 1000 nm inclusive, wherein a distance between the active layer and the top side is between 50 nm and 180 nm inclusive, and wherein a thickness of the first contact layer is at most 300 nm.

6. The optoelectronic component according to claim 1, wherein a first intermediate layer is arranged between the mirror layer and the semiconductor layer sequence, the first intermediate layer is electrically insulating with regard to the second semiconductor layer, wherein the first intermediate layer covers and form-fittingly reshapes the side wall in the recess, wherein a second contact layer is arranged between the first intermediate layer and the top side, wherein the second contact layer is in direct electrical and mechanical contact with the second semiconductor layer, and wherein the second contact layer and the mirror layer are electrically conductively connected to each other via vias in the first intermediate layer.

7. The optoelectronic component according to claim 1, wherein the entire bottom surface of the recess is covered by the first contact layer, wherein, in a region of the side wall, the first contact layer directly adjoins the semiconductor layer sequence, wherein, in the region of the side wall, no further material or no further layer is arranged between the semiconductor layer sequence and the first contact layer, and wherein a thickness of the first contact layer is chosen such that the first contact layer does not project beyond the active layer in a direction away from the bottom surface.

8. The optoelectronic component according to claim 1, wherein the contact pin is embedded in an electrically insulating filling material filling up the recess, and wherein contact pin is electrically insulated at least from the second semiconductor layer and from the mirror layer by the electrically insulating filling material.

9. The optoelectronic component according to claim 1, wherein the recess tapers in a direction to the bottom surface.

10. The optoelectronic component according to claim 1, wherein the recess broadens in the direction to the bottom surface.

11. The optoelectronic component according to claim 2, wherein in the region of the recess, the mirror layer is drawn at least as far toward the bottom surface so that in plan view of the side wall, the side wall is covered by the mirror layer at a level of the active layer, and wherein, in plan view of the side wall, at least 50% of the side wall is covered by the mirror layer.

12. The optoelectronic component according to claim 8, wherein the filling material is directly located at the mirror layer inside the recess, and wherein, on the top side, the filling material is arranged directly at the mirror layer and forms a layer on the mirror layer.

13. The optoelectronic component according to claim 8, wherein the filling material is in direct contact with the semiconductor layer sequence in the region of the recess, wherein the mirror layer is arranged at the filling material in the region of the recess, and wherein, throughout the whole region of the recess, the mirror layer extends substantially parallel to a main extension direction of the top side.

14. A method for producing an optoelectronic component, the method comprising:

A) providing a semiconductor layer sequence applied to a substrate, the semiconductor layer sequence comprising a top side facing away from the substrate, a first semiconductor layer facing the substrate, a second semiconductor layer facing away from the substrate and an active layer arranged between the first and second semiconductor layer;

B) applying a mask with at least one opening on the top side of the semiconductor layer sequence;

C) partial removal of the semiconductor layer sequence in a region of the opening so that a recess is formed in the semiconductor layer sequence, wherein the recess extends from the top side through the entire second semiconductor layer and the active layer and opens into the first semiconductor layer, and wherein, in a region of the first semiconductor layer, the recess has a bottom surface, which is delimited in a lateral direction, parallel to the active layer, by at least one side wall running transversely to the active layer;

D) depositing a first contact layer directly onto the first semiconductor layer in a region of the bottom surface, wherein a directional process and the same mask as in step C) are used for the deposition;

E) depositing a mirror layer on an upper side and in the region of the recess, wherein the mirror layer is electrically conductively connected to the second semiconductor layer; and
F) removing the mirror layer in the region above the first contact layer, wherein, when the component is finished, the mirror layer partially covers the recess as seen in plan view of the top side.

15. The method according to claim 14,
wherein, after step D) and before step E), a first intermediate layer is applied to the top side, the side wall and the first contact layer, the first intermediate layer form-fittingly reshapes the recess, and
wherein, in step E), the mirror layer is applied in a form-fitting manner to the first intermediate layer so that, in the region of the recess, the mirror layer extends at least partially transversely to the active layer and, in plan view of the side wall, at least a part of the side wall is covered by the mirror layer.

16. The method according to claim 14,
wherein, before the step E) a filling material is filled into the recess, the filling material completely fills the recess,
wherein, after the step F), a hole is formed in the filling material so that the first contact layer is exposed, and
wherein a contact pin is formed in the hole, the contact pin is guided, starting from the first contact layer, in a direction of the top side and exceeds the top side.

17. The method according to claim 15,
wherein, after step F), the recess is completely filled with a filling material,
wherein a hole is formed in the filling material and in the first intermediate layer so that the first contact layer is exposed, and
wherein a contact pin is formed in the hole, the contact pin is guided, starting from the first contact layer, in a direction of the top side and exceeds the top side.

\* \* \* \* \*